(12) United States Patent
Jang

(10) Patent No.: US 8,530,962 B2
(45) Date of Patent: Sep. 10, 2013

(54) TRANSISTOR OF SEMICONDUCTOR DEVICE AND METHOD FOR MANUFACTURING THE SAME

(75) Inventor: Kyoung Chul Jang, Seongnam (KR)

(73) Assignee: Hynix Semiconductor Inc, Icheon (KR)

( * ) Notice: Subject to any disclaimer, the term of this patent is extended or adjusted under 35 U.S.C. 154(b) by 452 days.

(21) Appl. No.: 12/839,244

(22) Filed: Jul. 19, 2010

(65) Prior Publication Data
US 2011/0260242 A1  Oct. 27, 2011

(30) Foreign Application Priority Data

Apr. 27, 2010 (KR) .......................... 10-2010-0039014

(51) Int. Cl.
*H01L 21/265* (2006.01)

(52) U.S. Cl.
USPC .............. 257/331; 257/E21.41; 257/E29.262; 438/270

(58) Field of Classification Search
USPC ........................................................ 257/331
See application file for complete search history.

(56) References Cited

U.S. PATENT DOCUMENTS

| | | | | |
|---|---|---|---|---|
| 8,173,506 | B2 * | 5/2012 | Jung et al. | ..................... 438/259 |
| 2008/0042173 | A1 | 2/2008 | Nam et al. | |
| 2009/0032887 | A1 * | 2/2009 | Jang et al. | ..................... 257/407 |
| 2009/0108368 | A1 * | 4/2009 | Kanegae et al. | .............. 257/369 |
| 2010/0001340 | A1 * | 1/2010 | Lee et al. | ..................... 257/334 |
| 2010/0311215 | A1 * | 12/2010 | Yoo | ............................. 438/270 |
| 2011/0275188 | A1 * | 11/2011 | Yoo | ............................. 438/270 |
| 2012/0264266 | A1 * | 10/2012 | Lee et al. | ..................... 438/270 |

FOREIGN PATENT DOCUMENTS

| | | |
|---|---|---|
| KR | 1020090012793 A | 2/2009 |
| KR | 1020090081615 A | 7/2009 |

OTHER PUBLICATIONS

Hitoshi Wakabayashi et al., "A Dual-Metal Gate CMOS Technology Using Nitrogen-Concentration-Controlled TiNx Film", IEEE Transactions on Electron Devices, Oct. 2001, pp. 2363-2369, vol. 48, No. 10, IEEE.

* cited by examiner

*Primary Examiner* — Fernando L Toledo
*Assistant Examiner* — Jaehwan Oh

(57) ABSTRACT

Provided are a transistor of a semiconductor device and a method for manufacturing the same. A gate induced drain leakage (GIDL) current is reduced by decreasing a work function at an upper portion of a gate electrode, and a threshold voltage of the transistor is maintained by maintaining a work function at a lower portion of the gate electrode at a high level, thereby reducing a leakage current of the transistor and reducing a read time and a write time of the semiconductor device. The transistor of the semiconductor device includes: a recess with a predetermined depth in a semiconductor substrate; a first gate electrode disposed within the recess; and a second gate electrode disposed on the first gate electrode into which ions of one or more of nitrogen (N), oxygen (O), arsenic (As), aluminum (Al), and hydrogen (H) are doped.

7 Claims, 5 Drawing Sheets

TRANSISTOR OF SEMICONDUCTOR DEVICE AND METHOD FOR MANUFACTURING THE SAME

CROSS-REFERENCE TO RELATED APPLICATION

The present application claims priority to Korean patent application number 10-2010-0039014, filed on Apr. 27, 2010, which is incorporated by reference in its entirety.

BACKGROUND OF THE INVENTION

The present invention relates to a transistor of a semiconductor device and a method for manufacturing the same. More particularly, the present invention relates to a transistor of a semiconductor device including a buried gate and a method for manufacturing the same.

Among semiconductor memory devices, a dynamic random access memory (DRAM) device includes a plurality of unit cells each having a capacitor and a transistor. The capacitor is used to temporarily store data, and the transistor is used to transfer data between a bit line and the capacitor in response to a control signal (word line). The data transfer occurs by using a semiconductor property where an electrical conductivity changes depending on environments. The transistor has three regions, i.e., a gate, a source, and a drain. Electric charges are moved between the source and the drain according to a control signal inputted to the gate of the transistor. The movement of the electric charges between the source and the drain is achieved through a channel region. The semiconductor property is used in the channel.

In a typical method for manufacturing a transistor, a gate is formed in a semiconductor substrate, and a source and a drain are formed by doping impurities into both sides of the gate. In this case, a channel region of the transistor is defined between the source and the drain under the gate. The transistor having a horizontal channel region occupies a predetermined area of a semiconductor substrate. In the case of a complicated semiconductor memory device, a plurality of transistors included in the semiconductor memory device makes it difficult to reduce a total area.

If the total area of the semiconductor memory device is reduced, the number of semiconductor memory devices per wafer is increased, thereby improving the productivity. Several methods for reducing the total area of the semiconductor memory device have been proposed. One method is to replace a conventional planar gate having a horizontal channel region by a recess gate in which a recess is formed in a substrate and a channel region is formed along a curved surface of the recess by forming a gate in the recess. Furthermore, a buried gate has been studied which can reduce a parasitic capacitance of a bit line by burying the entire gate within the recess.

Meanwhile, referring to a paper entitled "A Dual-Metal Gate CMOS Technology Using Nitrogen-Concentration-Controlled TiNx Film" (Hitoshi Wakabayashi et al; IEEE TRANSACTIONS ON ELECTRON DEVICES, VOL. 48, 10, NO. 10, October 2001) (hereinafter, referred to as a prior paper), it has been shown that if nitrogen ions (N+) are doped into a titanium nitride (TIN) film of a planar transistor gate, nitrogen composition of the TiN increases so that the work function ($\phi$) is reduced by approximately 100 mV. The work function is the minimum work or energy needed to move an electron from a material to the outside of the material.

According to the planar gate of the prior paper, a "region where the gate and the junction region contact each other" is identical to a "channel region under the gate." Thus, if the work function is reduced by the doping of nitrogen ions, the threshold voltage of the transistor is also reduced, causing performance degradation of the transistor.

BRIEF SUMMARY OF THE INVENTION

Various embodiments of the invention are directed to providing a transistor of a semiconductor device and a method for manufacturing the same, in which a gate induced drain leakage (GIDL) current is decreased by reducing a work function of an upper portion of a gate electrode, and a threshold voltage of the transistor is maintained by maintaining a work function of a lower portion of the gate electrode at a high level, thereby reducing a leakage current of the transistor and reducing a read time and a write time of the semiconductor device.

In an embodiment of the present invention, a transistor of a semiconductor device includes: a recess formed to a predetermined depth in a semiconductor substrate; a first gate electrode disposed within the recess; and a second gate electrode disposed on the first gate electrode into which ions of one or more of nitrogen (N), oxygen (O), arsenic (As), aluminum (Al), and hydrogen (H) are doped.

In another embodiment of the present invention, a method for manufacturing a transistor of a semiconductor device includes: forming a recess having a predetermined depth in a semiconductor substrate; burying a gate electrode within the recess; and doping ions into an upper portion of the gate electrode to form an ion-doped gate electrode on the upper portion of the gate electrode, wherein the doped ions include ions of one or more of nitrogen (N), oxygen (O), arsenic (As), aluminum (Al), and hydrogen (H).

DESCRIPTION OF EMBODIMENTS

Description will now be made in detail in reference to the embodiments of the present invention and accompanying drawings. Wherever possible, the same reference numbers will be used throughout the drawings to refer to the same or like elements.

Figure 1:
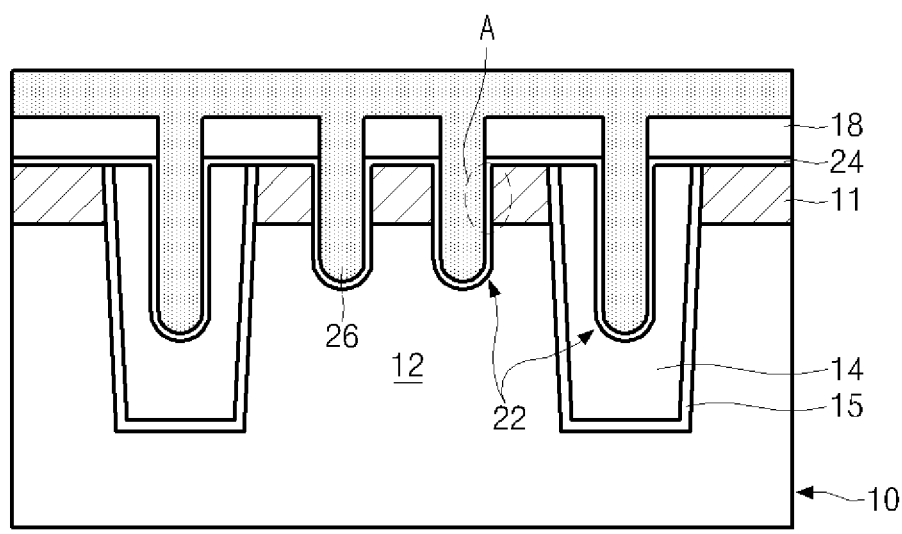
FIG. 1 is a cross-sectional view illustrating a transistor of a semiconductor device using a TiN film as a gate electrode.

FIG. 1 is a cross-sectional view illustrating a transistor of a semiconductor device using a TIN film as a gate electrode. The gate electrode is not limited to the TiN film and may include tantalum nitride (TaN) or molybdenum (Mo) as a gate electrode material. In the following description, a TIN material will be taken as an example. Referring to FIG. 1, the semiconductor device according to an embodiment of the present invention includes an active region 12 formed in a substrate 10, and a device isolation film 14 defining the active region 12.

The forming of the device isolation film 14 may include forming a trench having a predetermined depth in the substrate 10 using a shallow trench isolation (STI) process. Then burying an oxide film, such as a spin on dielectric (SOD) film or a high density plasma (HDP) film, within the trench. Before burying the oxide film within the trench, wall oxide, lining nitride or lining oxide 15 may be deposited thinly on the surface of the trench.

Junction regions 11 acting as a source and a drain are formed on the left and right sides of the gate electrode 26 in the semiconductor substrate 10, thereby constituting a transistor. The forming of the junction regions 11 includes forming a mask (not shown) exposing the junction regions 11 on the surface of the substrate 10 and doping ions into the exposed junction regions 11.

In addition, the semiconductor device includes a buried gate formed in recesses 22 in the semiconductor substrate 10. The buried gate includes the recess 22 formed to a predetermined depth in the active region 12 and the device isolation film 14, a gate oxide film 24 formed thinly on the surface of the recess 22, and the gate electrode 26 formed over the gate oxide film 24 in the recess 22. As described above, the gate electrode 26 illustrated FIG. 1 may include one or more materials among titanium nitride (TiN), tantalum nitride (TaN), and molybdenum (Mo).

In a method for manufacturing the buried gate, a hard mask 18 exposing the recess region is formed on the semiconductor substrate 10. The recess 22 having a predetermined depth is formed by etching the active region 12 and the device isolation film 14 using the hard mask 18 as a mask. At this time, the recess 22 in the device isolation film 14 is formed deeper by using an etch selectivity difference between silicon (Si; active region) and oxide film ($SiO_x$; device isolation film). The gate oxide film 24 is deposited thinly on the surface of the recess 22, and TiN is deposited as a gate electrode (26) material. Although not illustrated in FIG. 1, the upper portion of the gate electrode 26 is planarized by a chemical mechanical polishing (CMP) process, and the upper portion of the gate electrode 26 is removed by an etch-back process. Consequently, the gate electrodes 26 are separated from a neighboring gate electrode 26.

Since the buried gate formed in the above-described structure by the above-described method is buried in the lower portion of the substrate 10, a parasitic capacitance occurring between the gate and the bit line can be reduced. However, as indicated by reference symbol "A" in FIG. 1, there exists a region where the gate electrode 26 and the junction region 11 contact each other, and a leakage current known as a gate induced drain leakage (GIDL) current is generated in that region. When the GIDL current is generated, stored electric charges are discharged, causing the degradation in retention characteristics and refresh characteristics of semiconductor. Thus, it is necessary to reduce the GIDL current.

Figure 2:
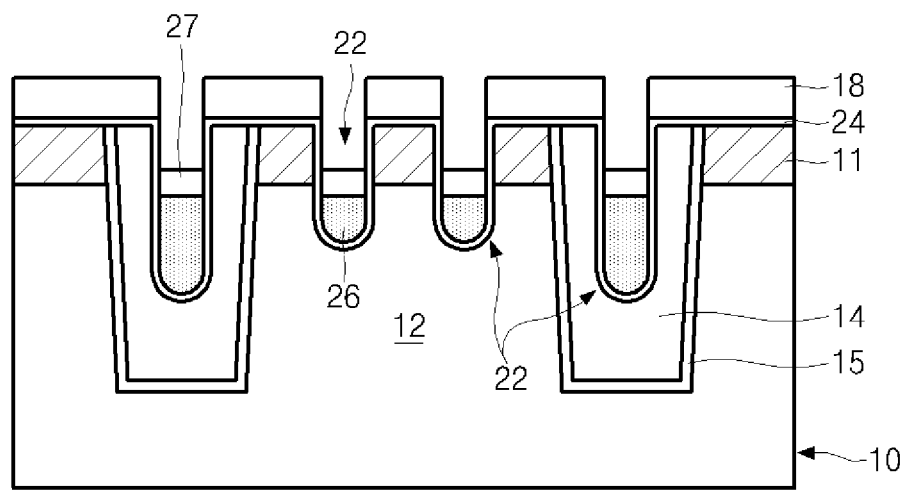
FIG. 2 is a cross-sectional view illustrating a transistor of a semiconductor device using a gate electrode which is formed by doping nitrogen ions into a TiN film according to an embodiment of the present invention.

FIG. 2 is a cross-sectional view illustrating a transistor of a semiconductor device using a gate electrode which is formed by doping nitrogen ions into a TiN film according to an embodiment of the present invention.

Referring to FIG. 2, the gate electrode according to an embodiment of the present invention includes a first gate electrode 26 disposed at a lower portion of a recess 22, and a second gate electrode 27 disposed at an upper portion of the recess 22. The first gate electrode 26 includes TiN, and the second gate electrode 27 includes TiN doped with one or more ions such as nitrogen (N), oxygen (O), arsenic (As), aluminum (Al), and hydrogen (H). For example, the second gate electrode 27 is initially formed of TiN (same as the first gate electrode 27) and then subjected to nitrogen ion implantation to form a nitrogen-abundant TiN film.

If ions such as nitrogen ions are doped into the gate electrode including TiN, the work function of the gate electrode material is reduced (see the prior paper), thereby preventing the occurrence of the GIDL current in the region where the gate electrode and the junction region 11 contact each other.

If ions such as nitrogen ions are doped into the entire gate electrode including TiN and the work function of the entire gate electrode is reduced, the work function at the lower portion of the gate electrode in which the channel is formed is reduced. Consequently, the threshold voltage of the transistor is lowered, causing the performance degradation of the transistor.

However, as illustrated in FIG. 2, when the gate electrode includes a TiN film as the first gate electrode 26 formed at the lower portion and a doped TiN film as the second gate electrode 27 at the upper portion, the work function at the upper portion of the gate electrode contacting the junction region 11 is reduced and thus the GIDL current is reduced. However, since the work function at the lower portion of the gate electrode in which the channel is formed is not reduced, the threshold voltage is maintained at a high level. These advantages can be obtained in the case of forming the gate electrode using TaN or Mo instead of TiN).

Although not illustrated in FIG. 2, an insulation film such as an oxide film and a nitride film can be formed over the second gate electrode 27 so as to fill the recess 22, thereby protecting the gate electrodes 26 and 27 from being attacked.

The gate electrodes 26 and 27 in the semiconductor device of FIG. 2 have been described. Since the other elements of the buried gate are substantially the same as those of FIG. 1, a duplicated description thereof will be omitted.

Figure 3:
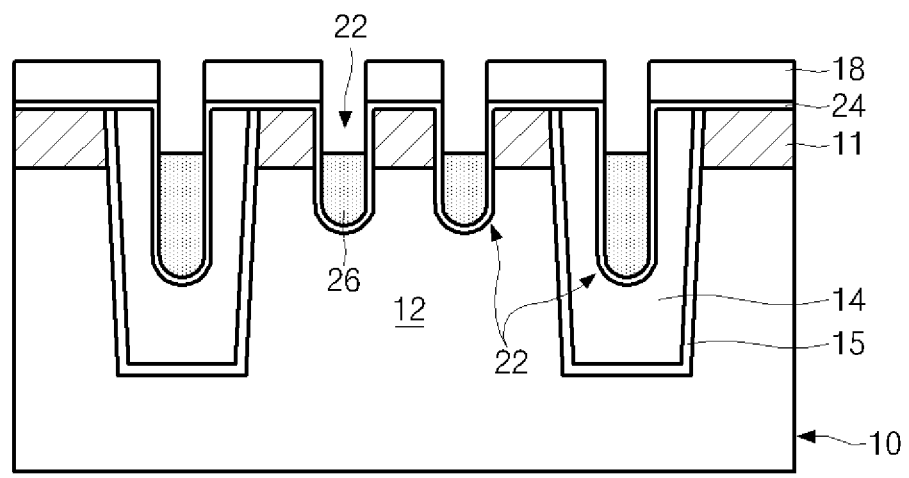
FIGS. 3 and 4 are cross-sectional views illustrating a method for manufacturing the transistor of the semiconductor device of FIG. 2.
Figure 4:
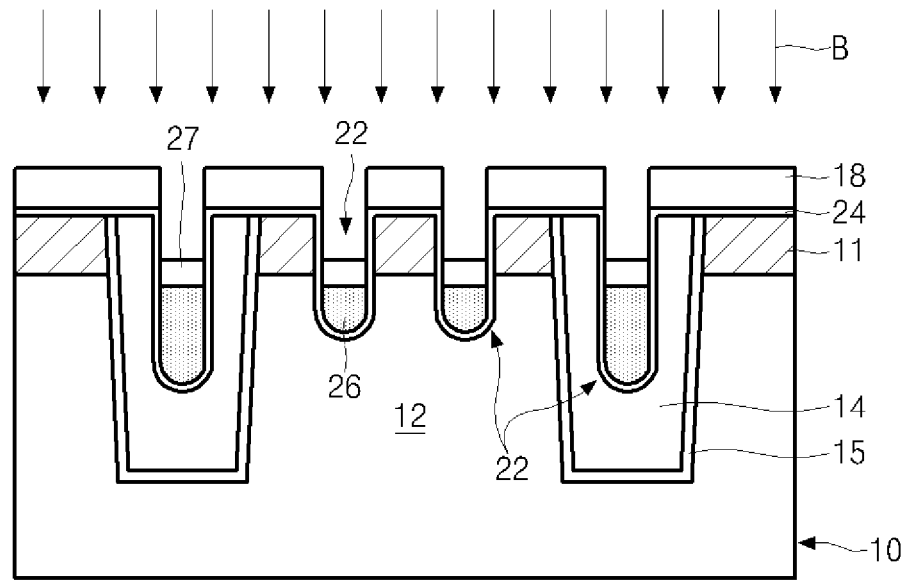

FIGS. 3 and 4 are cross-sectional views illustrating a method for manufacturing the transistor of the semiconductor device of FIG. 2. An active region 12, a device isolation film 14, and a junction region 11 are formed in the same manner as those in FIG. 1. A recess 22 for forming a buried gate is formed in the active region 12 and the device isolation film 14 by using hard mask patterns 18 as a mask.

As illustrated in FIG. 3, a gate electrode 26 is formed in the recess 22 to a predetermined depth. The gate electrode 26 may include one or more of TiN, TaN, and Mo.

As illustrated in FIG. 4, ions are doped using the hard mask patterns 18 as a mask. Consequently, the gate electrode 26 is divided into a first electrode 26 where ions are not doped, and a second gate electrode 27 where ions are doped. The doped ions may include one or more of nitrogen (N), oxygen (O), arsenic (As), aluminum (Al), and hydrogen (H).

The height of the second gate electrode 27 may be in the range of approximately 0.1% to approximately 80% with respect to the height of the first gate electrode 26. That is, even though the height of the second gate electrode 27 where the ions are doped is very small as compared with the height of the first gate electrode 26 (the case of 0.1%), work function reduction effect is obtainable. As the thickness of the second gate electrode 27 increases, the work function reduction effect also increases. However, when the thickness of the second gate electrode 27 exceeds 80% of the thickness of the first gate electrode 26, the work function of the first gate electrode 26 adjacent to the channel region is negatively influenced. Thus, the threshold voltage is lowered and the performance of the transistor is degraded.

When nitrogen (N) ions are doped into the second gate electrode 27, the second gate electrode 27 turns out a TiN layer having a high nitrogen concentration. In this case, the first gate electrode 26 also includes TiN. Assuming that the nitrogen (N) concentration of the first gate electrode 26 is "1", the nitrogen (N) concentration of the second gate electrode 27 may be in the range of approximately 1.001 to approximately 2. That is, the work function reduction effect is obtained with an even slight difference in an amount of nitrogen (N) ions between the first and the second gate electrodes 26 and 27, e.g., in a case where the second gate electrode 27 is by approximately 0.1% higher than the first gate electrode 26 in an amount of nitrogen (N) included in TiN. As an amount of the doped nitrogen ions increases, the work function reduction effect also increases. However, if the nitrogen in the second gate electrode 27 exceeds two times the nitrogen (N) in the first gate electrode 26, the work function of the first gate electrode 26 is negatively influenced. Consequently, the threshold voltage is lowered and the performance of the transistor is degraded.

Figure 5:
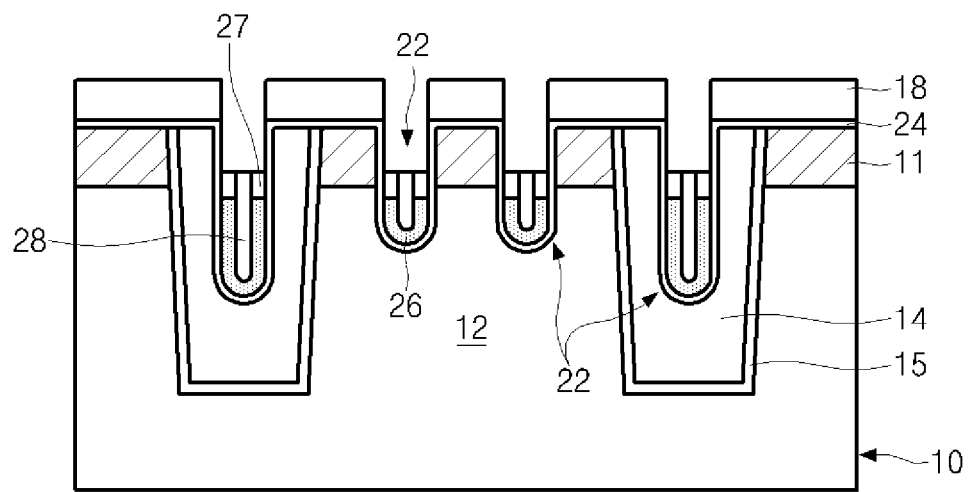
FIG. 5 is a cross-sectional view illustrating a transistor of a semiconductor device according to another embodiment of the present invention.

FIG. 5 is a cross-sectional view illustrating a transistor of a semiconductor device according to another embodiment of the present invention. Referring to FIG. 5, a gate electrode is formed of a stack structure of first and second gate electrodes 26 and 27 including TiN and a tungsten film 28. That is, the gate electrode includes TiN films 26 and 27 formed on the surface of the recess 22, and a tungsten (W) film 28 planted in a center portion of the TiN films 26 and 27. If the gate electrode is formed in the stack structure of TiN and W, the resistance is reduced as compared to the TiN-only structure, and thus a read time and a write time of the semiconductor device are reduced.

The method of forming the tungsten (W) film includes: forming the first gate electrode 26 including TiN along a sidewall of the recess 22; making the first gate electrode (26) recessed into the recess 22 by an etch-back process; and filling the recess 22 with tungsten (W) so that the tungsten (W) layer is surrounded by the gate electrode 26 in the recess 22. In this manner, as illustrated in FIG. 5, a stack structure of tungsten and TiN is formed. Then, the ion-doped second gate electrode 27 is formed by doping ions into the upper portion of the first gate electrode 26.

In the stack structure of the TiN film 26 and the tungsten film 27 illustrated in FIG. 5, the ion-doped TiN film (27, the second gate electrode) is formed by doping ions into the upper portion of the TiN film (26, the first gate electrode). In this case, the doped ions can prevent the GIDL current effect from occurring or threshold voltage from being lowered. Since the work function in the second gate electrode 27 formed at a similar level to the junction region 11 is reduced by the doped ions, GIDL current becomes reduced. The work function in the first gate electrode 26 in which the channel is formed is not reduced, and the threshold voltage can be maintained at a high level. Consequently, the leakage current of the transistor can be reduced, and the read time and the write time of the semiconductor device can be reduced.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A transistor of a semiconductor device, comprising:
a recess having a predetermined depth in a semiconductor substrate;
a junction region provided both sides of the recess in the semiconductor;
a first gate electrode provided within the recess; and
a second gate electrode provided within the recess and over the first gate electrode, the second gate electrode having dopants disposed therein,
wherein the dopants include any of nitrogen (N), oxygen (O), arsenic (As), aluminum (Al), hydrogen (H), and a combination thereof, and
wherein the first gate electrode is not overlapped with the junction region but the second gate electrode is overlapped with the junction thereof.

2. The transistor according to claim 1, wherein the first gate electrode and the second gate electrode each includes any of titanium nitride (TiN), tantalum nitride (TaN), molybdenum (Mo), and a combination thereof.

3. The transistor according to claim 1, wherein the dopants include nitrogen (N) ions that are implanted into the second gate electrode, and the second gate electrode having a dopant concentration that is greater than that of the first gate electrode.

4. The transistor according to claim 3, wherein, a ratio of a nitrogen concentration of the first gate electrode and a nitrogen concentration of the second gate electrode is between 1:1.001 to 1:2.

5. The transistor according to claim 1, wherein a height of the second gate electrode is in the range of approximately 0.1% to approximately 80% with respect to a height of the first gate electrode.

6. The transistor according to claim 1, further comprising a tungsten (W) film formed in a center portion of the recess so as to be surrounded by the first gate electrode and the second gate electrode.

7. The transistor according to claim 1, further comprising an insulation film formed over the second gate electrode in the recess and including an oxide film or a nitride film.

* * * * *